US011983132B2

(12) United States Patent
Lambert

(10) Patent No.: US 11,983,132 B2
(45) Date of Patent: May 14, 2024

(54) USB CONNECTOR FUNCTIONALITY MODIFICATION SYSTEM

(71) Applicant: Dell Products L.P., Round Rock, TX (US)

(72) Inventor: Timothy M. Lambert, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 75 days.

(21) Appl. No.: 17/583,409

(22) Filed: Jan. 25, 2022

(65) Prior Publication Data

US 2023/0237003 A1 Jul. 27, 2023

(51) Int. Cl.
*G06F 13/40* (2006.01)
*G06F 13/38* (2006.01)
*G06F 13/42* (2006.01)
*H03K 19/173* (2006.01)

(52) U.S. Cl.
CPC ........ *G06F 13/4027* (2013.01); *G06F 13/382* (2013.01); *G06F 13/409* (2013.01); *G06F 13/4282* (2013.01); *H03K 19/1737* (2013.01)

(58) Field of Classification Search
None
See application file for complete search history.

(56) References Cited

U.S. PATENT DOCUMENTS

| 8,200,852 | B2 * | 6/2012 | Liu ..................... G06F 13/4081 370/464 |
| 9,959,239 | B2 * | 5/2018 | Voor ................... G06F 13/4282 |
| 10,162,779 | B2 * | 12/2018 | Schnell ............... G06F 13/4282 |
| 10,691,527 | B2 * | 6/2020 | Ryu .................... G06F 11/0751 |
| 10,705,566 | B2 * | 7/2020 | DeCamp ............. G06F 13/4282 |
| 11,176,078 | B2 * | 11/2021 | Lee ....................... H02J 7/0029 |
| 2010/0026908 | A1 * | 2/2010 | Lin ...................... G03B 21/005 348/744 |
| 2017/0123449 | A1 * | 5/2017 | Ahmed ..................... G06F 1/16 |
| 2019/0019638 | A1 * | 1/2019 | Humphreys ........ G06F 11/2736 |
| 2019/0042503 | A1 * | 2/2019 | Montero ............. G06F 13/4282 |
| 2020/0259896 | A1 * | 8/2020 | Sachs ..................... H04L 67/10 |
| 2021/0258774 | A1 * | 8/2021 | Ramsay, III .......... H04W 12/69 |

* cited by examiner

*Primary Examiner* — Henry Tsai
*Assistant Examiner* — Christopher A Bartels
(74) *Attorney, Agent, or Firm* — Joseph Mencher

(57) ABSTRACT

A Universal Serial Bus (USB) connector functionality modification system includes a USB connector coupled to a first subsystem and a second subsystem by a multiplexer device. A USB connector functionality modification subsystem is coupled to the multiplexer device and operates to receive a USB connector functionality modification instruction while the multiplexer device is configured to allow the first subsystem to transmit and receive data via the USB connector and the second subsystem cannot transmit and receive data via the USB connector. In response to receiving the USB connector functionality modification instruction, the USB connector functionality modification subsystem reconfigures the multiplexer device to allow the second subsystem to transmit and receive data via the USB connector while the first subsystem cannot transmit and receive data via the USB connector.

20 Claims, 12 Drawing Sheets

USB CONNECTOR FUNCTIONALITY MODIFICATION SYSTEM

BACKGROUND

The present disclosure relates generally to information handling systems, and more particularly to modifying functionality of a USB connector on an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, typically include connectors on their surface in order to allow other devices to be connected to those server devices. However, some connector functionality may be desired for some users and not for others, which raises issues for a server device manufacturer/provider as to how to provide such connector functionality to the users that desire it, while also reducing the cost of server devices for customers that do not desire it. To provide a specific example, some users may desire server devices with video functionality provided via a video connector (e.g., a DisplayPort video connector), enhanced speed USB functionality provided via a "super-speed" Universal Serial Bus (USB) connector (e.g., a USB 3.1 connector), and remote access controller device management functionality provided via a remote access controller connector (e.g., a USB microAB connector). However, other users may not desire the video functionality and enhanced speed USB functionality discussed above. In either situation, enabling the provisioning of multiple connectors with accessibility on the outer surface of the server device (e.g., typically on a control panel on the front surface of the server device) utilizes valuable outer surface space on the server device and increases costs. For example, a "base version" for the server device will have to be designed, as well as allocate space, to accommodate connectors that are not desired by some users, thus occupying space in those server devices that is not utilized, and increasing the costs of those server devices.

Accordingly, it would be desirable to reduce the number of connectors required to provide any particular combination of functionality.

SUMMARY

According to one embodiment, an Information Handling System (IHS) includes a processing system; and a memory system that is coupled to the processing system and that includes instructions that, when executed by the processing system, cause the processing system to provide a USB connector functionality modification engine that is configured to: receive, while a multiplexer device is configured to allow a first subsystem to transmit and receive data via a USB connector while a second subsystem cannot transmit and receive data via the USB connector, a USB connector functionality modification instruction; and reconfigure, in response to receiving the USB connector functionality modification instruction, the multiplexer device to allow the second subsystem to transmit and receive data via the USB connector while the first subsystem cannot transmit and receive data via the USB connector.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
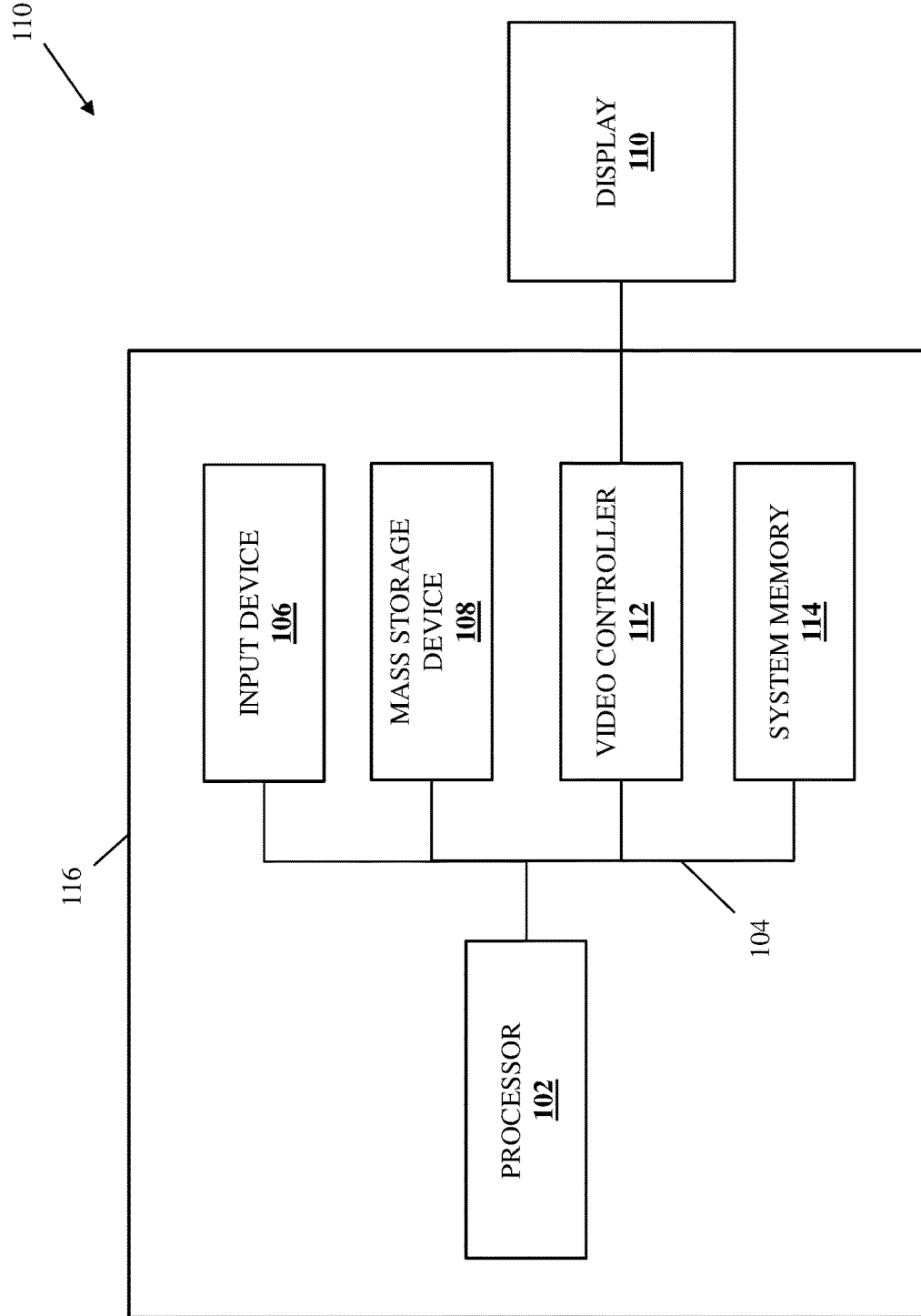
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
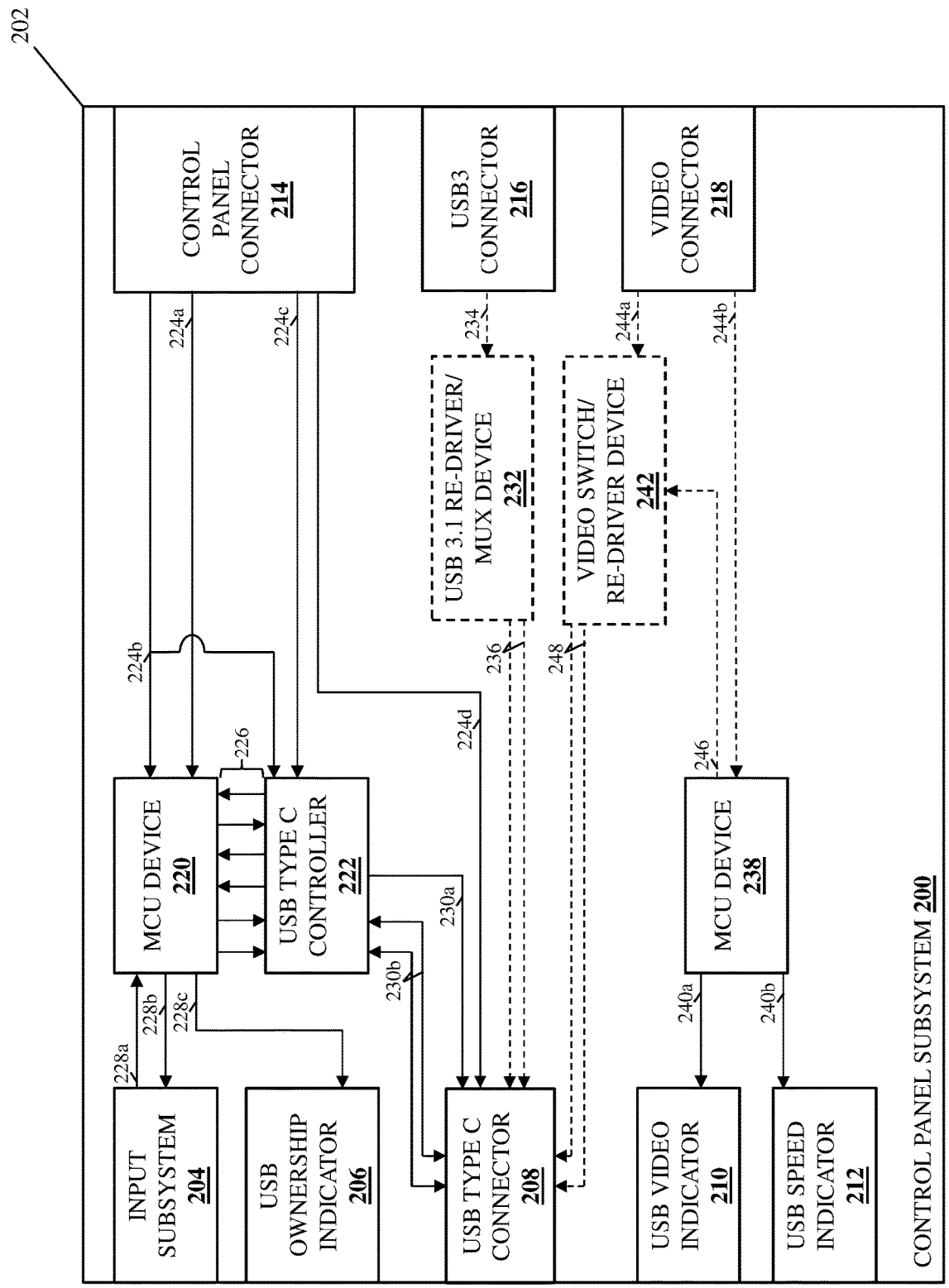
FIG. 2 is a schematic view illustrating an embodiment of a control panel subsystem that may provide a portion of the USB connector functionality modification system of the present disclosure.

Referring now to FIG. 2, an embodiment of a control panel subsystem 200 is illustrated that may provide a portion of the USB connector functionality modification system of the present disclosure. As discussed below, in an embodiment, the control panel subsystem 200 may be provided in the IHS 100 discussed above with reference to FIG. 1 and/or may provide some of the components of the IHS 100, and in specific examples provides an outer surface of a server device and includes an input button, indicators, and the USB connector described below, as well as subsystems that provide the USB connector functionality modification described in further detail below.

In the illustrated embodiment, the control panel subsystem 200 includes a chassis 202 that may be provided by a circuit board and/or other control panel chassis components that would be apparent to one of skill in the art in possession of the present disclosure. An input subsystem 204 is included on the chassis 202 and, in a specific example, may be provided by an input button or other actuatable subsystems that would be apparent to one of skill in the art in possession of the present disclosure. A USB ownership indicator 206 is also included in the chassis 202, and, in a specific example, may be provide by a Light Emitting Device (LED) and/or other indicators that would be apparent to one of skill in the art in possession of the present disclosure. A USB connector 208 is also included in the chassis 202 and, in the specific examples illustrated and described below, is provided by a USB Type-C connector, although one of skill in the art in possession of the present disclosure will appreciate how the teachings of the present disclosure may benefit other connectors and thus those connectors may fall within its scope as well. A USB video indicator 206 is also included in the chassis 202 and, in a specific example, may be provided by an LED and/or other indicators that would be apparent to one of skill in the art in possession of the present disclosure. A USB speed indicator 206 is also included in the chassis 202 and, in a specific example, may be provide by an LED and/or other indicators that would be apparent to one of skill in the art in possession of the present disclosure.

A control panel connector 214 is also included in the chassis 202 and may include any connector that one of skill in the art in possession of the present disclosure would recognize as being capable of connecting a control panel subsystem to a circuit board subsystem such as a motherboard or other planar. An internal USB connector 216 is also included in the chassis 202 and, in the specific examples illustrated and described below, is provided by an internal USB3 connector, although as discussed above the teachings of the present disclosure may benefit other connectors and thus those connectors are envisioned as falling within its scope as well. A video connector 218 is also included in the chassis 202 and, in a specific example, may be provided by a DisplayPort video connector, although other video connectors (e.g., a High Definition Multimedia Interface (HDMI) connector, a Video Graphics Array (VGA) connector, etc.) are envisioned as falling within the scope of the present disclosure as well.

As discussed in further detail below, the USB connector functionality modification system of the present disclosure includes a USB connector functionality modification subsystem/engine that is configured to perform the operations that enable the USB connector functionality modification described herein. In the specific embodiments illustrated and discussed below, the USB connector functionality modification subsystem/engine is provided, at least in part, by a MicroController Unit (MCU) device 220 that is included on the chassis 202, although one of skill in the art in possession of the present disclosure will appreciate how other processing systems may be utilized to provide similar functionality while remaining within the scope of the present disclosure as well. A USB controller 222 is also included in the chassis 202 and, in the specific examples illustrated and described below, is provided by a USB Type-C controller, although as discussed above the teachings of the present disclosure may benefit other connectors and thus other corresponding connector controllers may fall within its scope as well.

In the specific example illustrated in FIG. 2, the control panel connector 214 is connected to the MCU device 220 by a control panel 1-wire connection 224a, to both the MCU device 220 and the USB controller 222 by an Inter-Integrated Circuit (I2C) connection 224b, to the USB controller 222 by power connection 224c, and to the USB connector 208 by a USB 2.0 connection 224d. Furthermore, the MCU device 220 and the USB controller 222 are connected to each other by a plurality of USB controller connections 226 (e.g., connections that are configured to transmit USB controller "EN_N" signals, "PORT" signals, "INT_N" signals, "ID" signals, "EN" signals, "OC" signals, and/or other USB controller signals that would be apparent to one of skill in the art in possession of the present disclosure). The MCU device 220 is connected to the input subsystem 204 by an actuation detection connection 228a that is discussed below and an indicator activation connection 228b that may be utilized to illuminate an LED included in the input subsystem 204, and to the USB ownership indicator 206 by an indicator activation connection 228c. The USB controller 222 is connected to the USB connector 208 by a power connection 230a, as well as by a pair of configuration channel (CC) connections 230b.

FIG. 2 also illustrates how the control panel subsystem 200 is configurable to include optional components, which are illustrated in dashed lines in FIG. 2. FIG. 2 illustrates an example in which the control panel subsystem 200 may be configurable to include a USB re-driver/multiplexer device 232 that, in the specific examples illustrated and described below, is provided by a USB 3.1 re-driver/multiplexer device, although as discussed above the teachings of the present disclosure may benefit other connectors and thus other re-driver/multiplexer devices may fall within its scope as well. In the specific example illustrated in FIG. 2, the internal USB connector 216 is configurable to couple to the USB re-driver/multiplexer device 232 by a USB connection 234 that may be provided by a USB 3.1 connection (i.e., when the USB re-driver/multiplexer device 232 is provided by a USB 3.1 re-driver/multiplexer device). The USB connector 208 is also configurable to couple to the USB re-driver/multiplexer device 232 by a pair of USB connections 236 that may be provided by USB 3.1 connections (i.e., when the USB re-driver/multiplexer device 232 is provided by a USB 3.1 re-driver/multiplexer device).

An MCU device 238 is also included on the chassis 202 and connected to the USB video indicator 210 by an indicator activation connection 240a, as well as connected to the USB speed indicator 212 by an indicator activation connection 240b. FIG. 2 also illustrates an example in which the control panel subsystem 200 may be configurable to include a video switch/re-driver device 242 that, in the examples below may be provided by a DisplayPort switch/re-driver device, but that in other embodiments may also be provided by an HDMI switch/re-driver device, a VGA switch/re-driver device, and/or other video switch re-driver devices that would be apparent to one of skill in the art in possession of the present disclosure. In the specific example illustrated in FIG. 2, the video connector 218 is configurable to couple to the video switch/re-driver device 242 by a video connection 244a that in the examples below is provided by a DisplayPort connection, but that may be provided by an HDMI connection, a VGA connection, and/or other video connections that would be apparent to one of skill in the art in possession of the present disclosure. The video connector 218 is also configurable to couple to the MCU device 238 by a video cable present detect connection 244b. The MCU device 238 is configurable to connect to the video switch/re-driver device 242 by a multiplexer select connection 246. The video switch/re-driver device 242 is configurable to connect to the USB connector 208 by a pair of video connections 248 that in the examples below are provided by DisplayPort connections, but that in other embodiments may be provided by an HDMI connections, a VGA connections, and/or other video connections that would be apparent to one of skill in the art in possession of the present disclosure.

As discussed below and will be appreciated by one of skill in the art in possession of the present disclosure, the inclusion of the optional USB 3.1 re-driver/multiplexer device and USB 3.1 connections illustrated in FIG. 2 will operate to "upgrade" the USB connector 208 from a "high-speed" USB connector to a "super-speed" USB connector, while the inclusion of the optional video switch/re-driver device and video connections illustrated in FIG. 2 will operate to "upgrade" the USB connector 208 to provide a video connection. However, while a specific control panel system 200 has been illustrated and described, one of skill in the art in possession of the present disclosure will recognize that the USB connector functionality modification system of the present disclosure may include a variety of components and component configurations for configuring the USB connector 208 to perform different functionality while remaining within the scope of the present disclosure as well.

Figure 3:
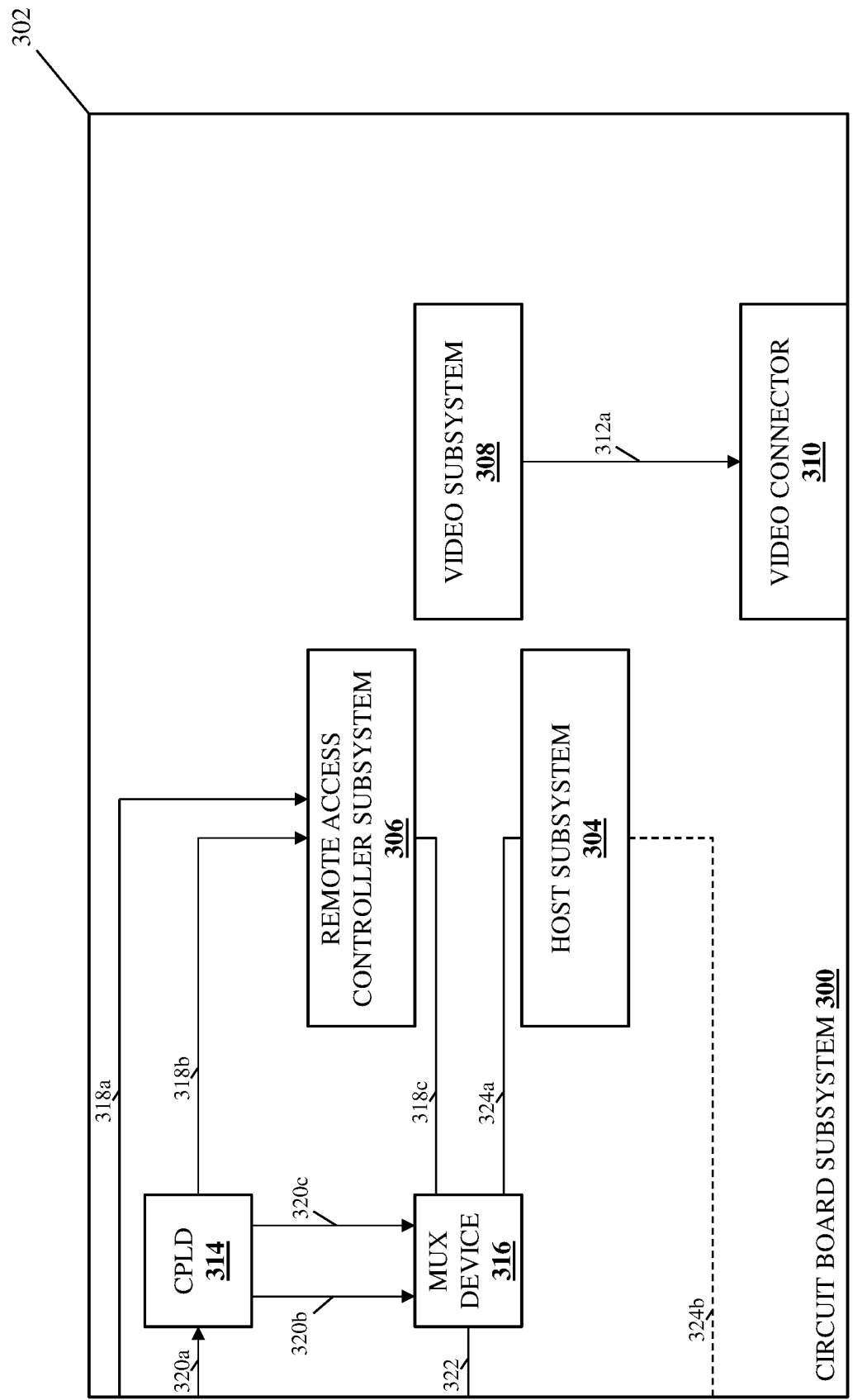
FIG. 3 is a schematic view illustrating an embodiment of a circuit board subsystem that may provide a portion of the USB connector functionality modification system of the present disclosure.

Referring now to FIG. 3, an embodiment of a circuit board subsystem 300 is illustrated that may provide a portion of the USB connector functionality modification system of the present disclosure. As discussed below, in an embodiment, the circuit board subsystem 300 may be provided in the IHS 100 discussed above with reference to FIG. 1 and/or may provide some of the components of the IHS 100, and in specific examples is provided by a motherboard or other planar in a server device and includes the host subsystem and the remote access controller subsystem described below, as well as subsystems that provide the USB connector functionality modification described in further detail below.

In the illustrated embodiment, the circuit board subsystem 300 includes a chassis 302 that may be provided by a circuit board and/or other circuit board chassis components that would be apparent to one of skill in the art in possession of the present disclosure. A host subsystem 304 is included on the chassis 202 and, in a specific example, may be provided by an x86 host subsystem and/or other host subsystems that would be apparent to one of skill in the art in possession of the present disclosure. A remote access controller subsystem 306 is also included on the chassis 202 and, in a specific example, may be provided by an integrated DELL® Remote Access Controller (iDRAC) available in servers provided by DELL® Inc. of Round Rock, Texas, United States; a Baseboard Management Controller (BMC); and/or other remote access controller subsystems that would be apparent to one of skill in the art in possession of the present disclosure. A video subsystem 308 is included on the chassis 302 and, in different embodiments, may be part of (or controlled by) either of the host subsystem 304 or the remote access controller subsystem 306. An internal video connector 310 is included on the chassis 302 and, in the specific examples below, is provided by a DisplayPort connector, but in other embodiments may be provided by an HDMI connector, a VGA connector, and/or other video connectors that would be apparent to one of skill in the art in possession of the present disclosure. In the example illustrated in FIG. 3, the video subsystem 308 is connected to the internal video connector 310 by a video connection 312a that, in the specific examples below is provided by a DisplayPort connection, but in other embodiments may be provided by an HDMI connection, a VGA connection, and/or other video connections that would be apparent to one of skill in the art in possession of the present disclosure.

As discussed in further detail below, the USB connector functionality modification system of the present disclosure includes a USB connector functionality modification subsystem/engine that is configured to perform the operations that enable the USB connector functionality modification described herein. In the specific embodiments illustrated and discussed below, and the USB connector functionality modification subsystem/engine is provided, at least in part, by a Complex Programmable Logic Device (CPLD) 314 that is included on the chassis 202, although one of skill in the art in possession of the present disclosure will appreciate how other processing systems may be utilized to provide that functionality while remaining within the scope of the present disclosure as well. A multiplexer device 316 is also included in the chassis 202.

In the specific example illustrated in FIG. 3, the remote access controller subsystem 306 is connected to an I2C connection 318a that, as described below, is configured to connect to the control panel subsystem 200 discussed above with reference to FIG. 2. The remote access controller subsystem 306 is also connected to the CPLD 314 by a Serial Peripheral Interface (SPIX) connection 318b, and to the multiplexer device 316 by a USB2 On-The-Go (OTG) connection 318c. The CPLD 314 is connected to a control panel 1-wire connection 320a that, as described below, is configured to connect to the control panel subsystem 200 discussed above with reference to FIG. 2. The CPLD is also connected to the multiplexer device 316 by CPLD connections 320b and 320c (e.g., which may be configured to transmit CPLD "OE" signals and CPLD "SEL" signals). The multiplexer device 316d is connected to an USB 2.0 connection 322 that, as described below, is configured to connect to the control panel subsystem 200 discussed above with reference to FIG. 2. The host subsystem 304 is connected to the multiplexer 316 by a USB2 connection 324a, and is configurable to connect to the control panel subsystem 200 discussed above with reference to FIG. 2 via a USB cable 324b (e.g., a USB 3.1 "super-speed" cable when the USB connector 208 is upgraded from a "high-speed" USB connector to a "super-speed" USB connector).

Figure 4:
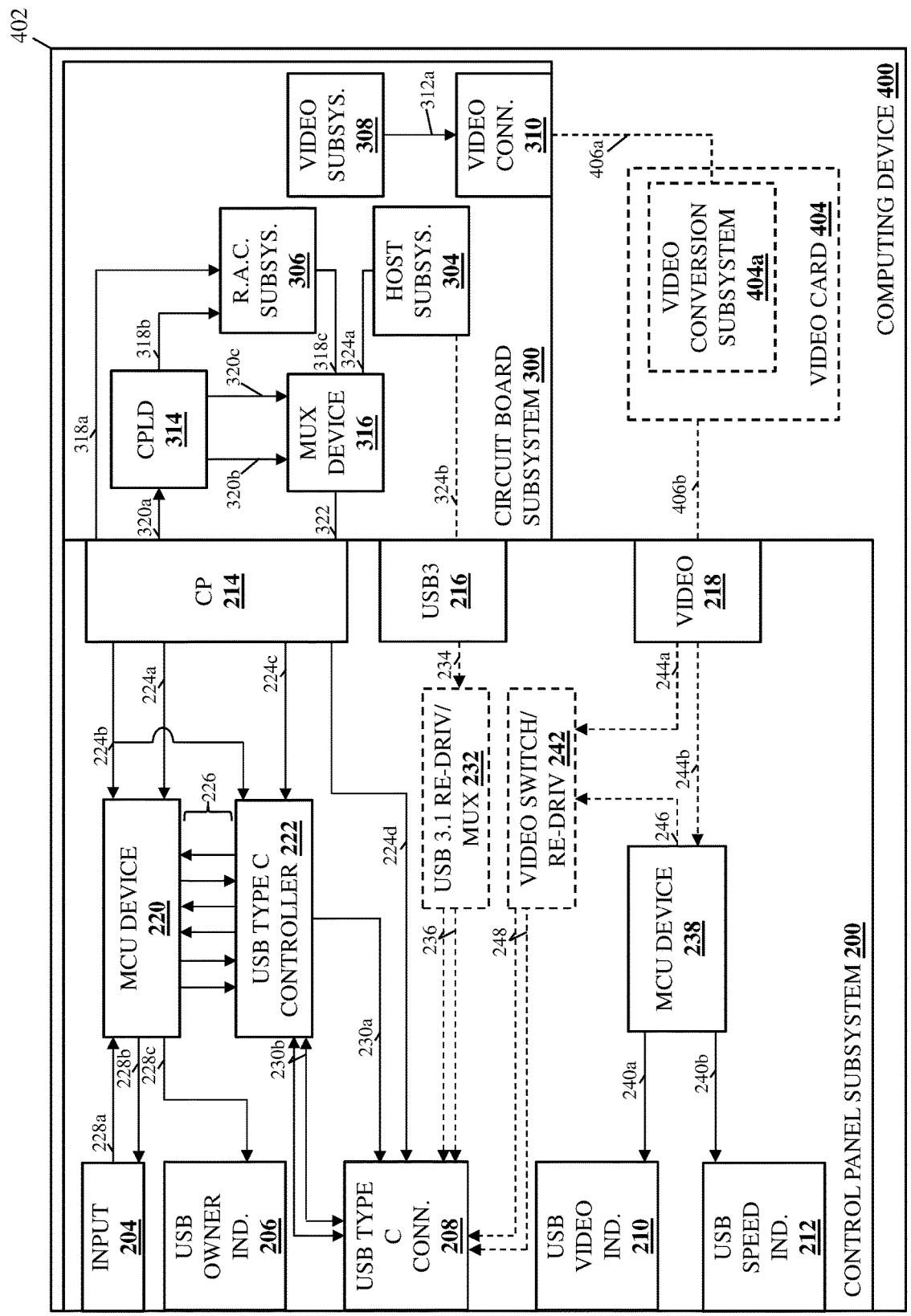
FIG. 4 is a schematic view illustrating an embodiment of a computing device including the circuit board subsystem of FIG. 2 and the circuit board subsystem of FIG. 3 to provide the USB connector functionality modification system of the present disclosure.

Referring now to FIG. 4, a computing device 400 is illustrated that may house the control panel subsystem 200 discussed above with reference to FIG. 2, and the circuit board subsystem 300 discussed above with reference to FIG. 3. In an embodiment, the computing device 400 may be provided by the IHS 100 discussed above with reference to FIG. 1 and/or may provide some of the components of the IHS 100, and in specific examples is provided by a server device. However, while described as a server device, one of skill in the art in possession of the present disclosure will appreciate how the systems and methods of the present disclosure may be provided in a variety of computing devices while remaining within its scope. In the illustrated embodiment, the computing device 400 includes a chassis 402 that house the components of the computing device 400, only some of which are illustrated and described below.

In the illustrated embodiment, the circuit board subsystem 300 and the control panel subsystem 200 have been positioned in the chassis 402 of the computing device 400, with the control panel subsystem 200 connected to the circuit board subsystem 300 via the control panel connector 214. In addition, FIG. 4 illustrates how the internal USB connector 216 may optionally be utilized to connect the host subsystem 304 to the USB re-driver/multiplexer device 232 via the USB connection 234 and USB cable 324b (e.g., when the USB connector 208 is upgraded from a "high-speed" USB connector to a "super-speed" USB connector), discussed in further detail below. FIG. 4 also illustrates how a video card 404 including a video conversion subsystem 404a may optionally be provided in the chassis 402, with the video conversion subsystem 404a connected to the internal video connector 310 by a video cable 406a, and how the video connector 218 may optionally be utilized to connect the video card 404 to the video switch/re-driver 242 via a video cable 406b (e.g., when the USB connector 208 is upgraded from to provide video), discussed in further detail below. In the specific examples provided below, a DisplayPort card (the video card 404) is provided with a VGA-to-DisplayPort converter (the video conversion subsystem 404a), and connected to the internal video connector 310 (an internal VGA connector) via VGA cable (the video cable 406a) and to a DisplayPort connector (the video connector 218) via a DisplayPort cable (the video cable 406b), although one of skill in the art in possession of the present disclosure will appreciate how other video technologies may be substituted for VGA and DisplayPort while remaining within the scope of the present disclosure as well.

Figure 5:
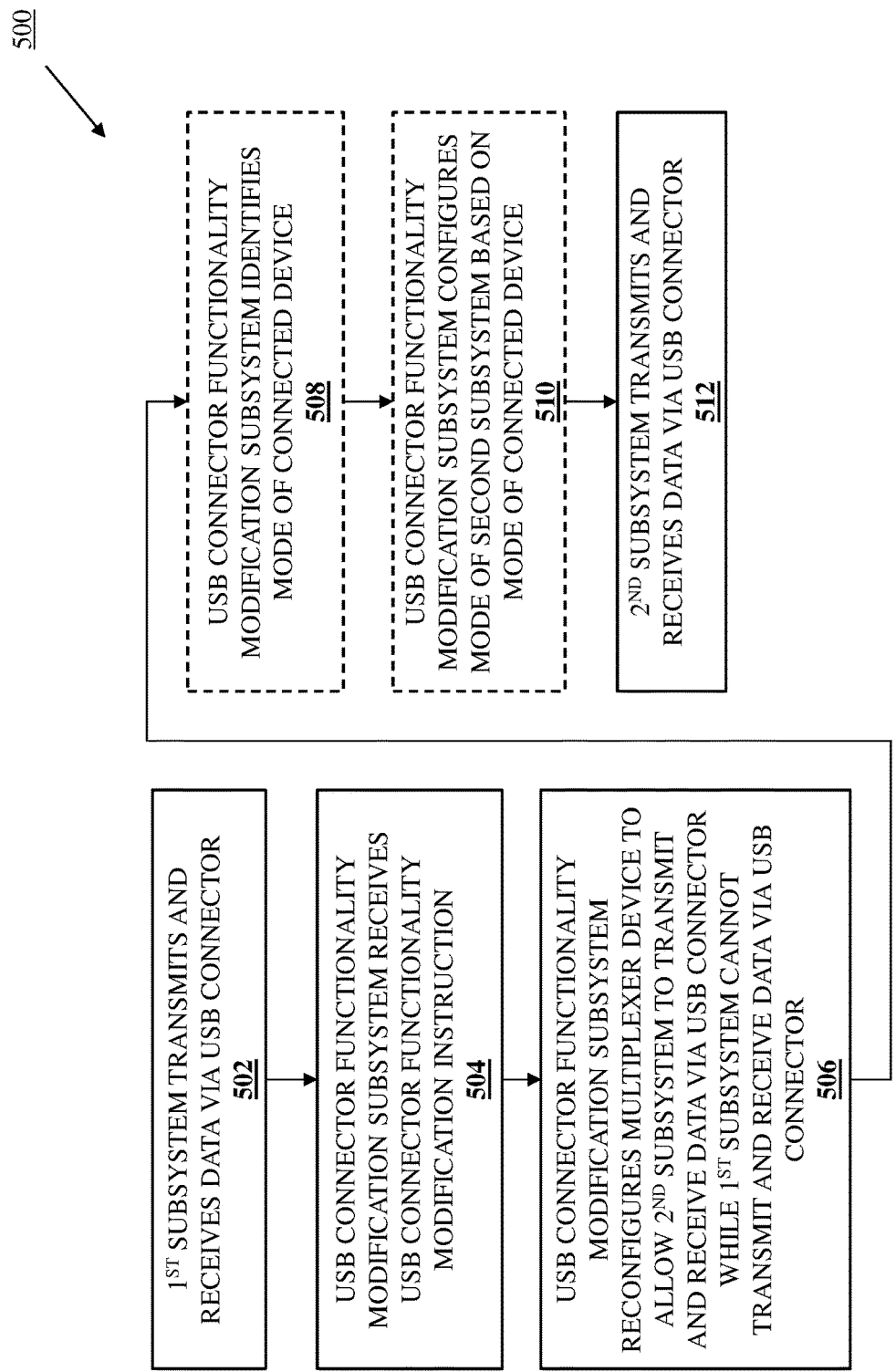
FIG. 5 is a flow chart illustrating an embodiment of a method for modifying USB connector functionality.

Referring now to FIG. 5, an embodiment of a method 500 for modifying functionality of a Universal Serial Bus (USB) connector is illustrated. As discussed below, the systems and methods of the present disclosure provide for modification of the functionality of a USB connector by changing the "ownership" of the USB connector between different subsystems in a computing device and providing an ownership indication to a user, modifying the speed of the USB connector via an enhanced USB functionality subsystem and providing a speed indication to a user, and enabling video using the USB connector via an enhanced USB functionality subsystem and providing a video-enabled indication to a user. For example, the USB connector functionality modification system includes a USB connector coupled to a first subsystem and a second subsystem by a multiplexer device. A USB connector functionality modification subsystem is coupled to the multiplexer device and operates to receive a USB connector functionality modification instruction while the multiplexer device is configured to allow the first subsystem to transmit and receive data via the USB connector and the second subsystem cannot transmit and receive data via the USB connector. In response to receiving the USB connector functionality modification instruction, the USB connector functionality modification subsystem reconfigures the multiplexer device to allow the second subsystem to transmit and receive data via the USB connector while the first subsystem cannot transmit and receive data via the USB connector. As such, the ownership of the USB connector may be modified so that different subsystems may utilize the USB connector while other subsystems may not.

Figure 6A:
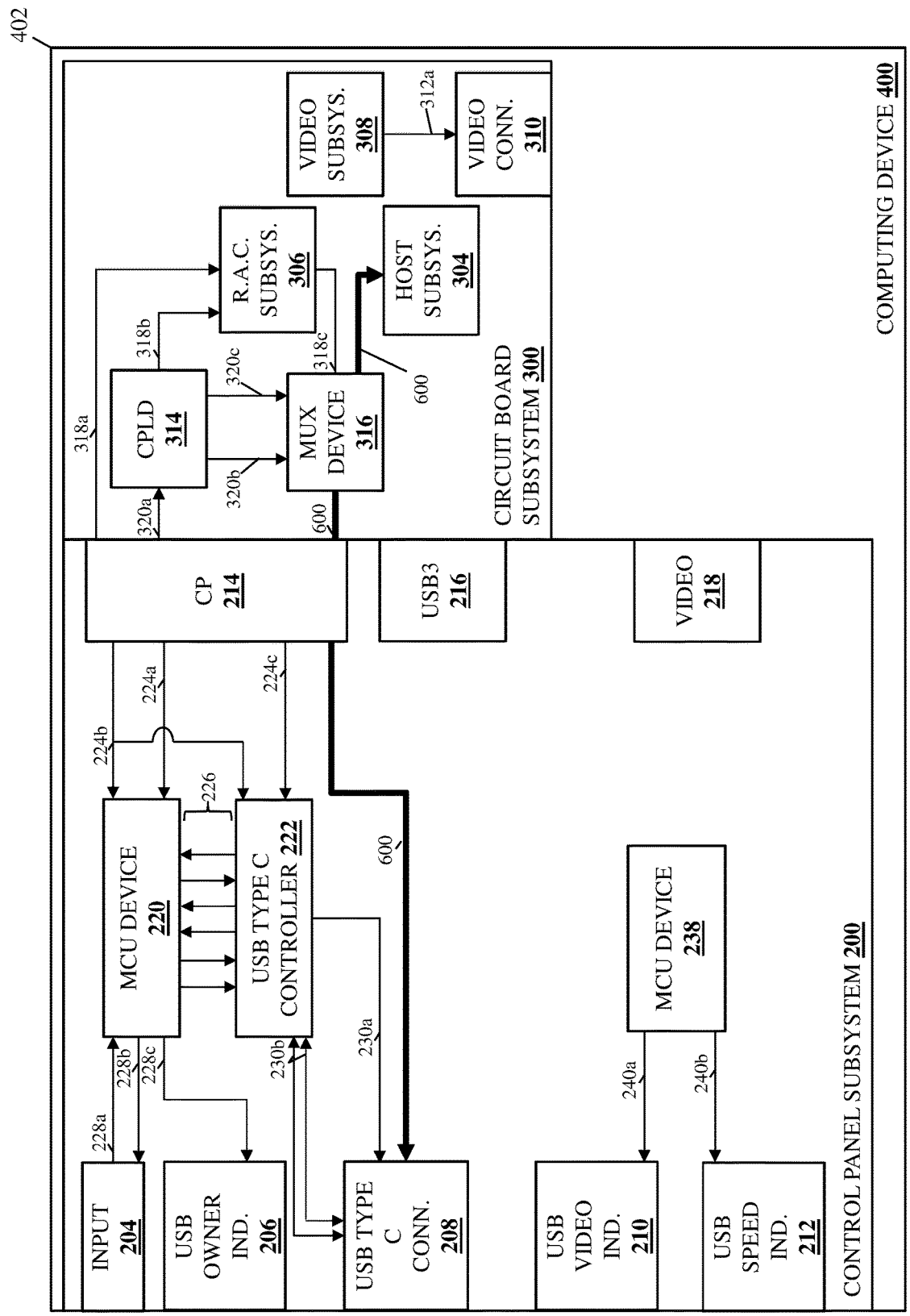
FIG. 6A is a schematic view illustrating an embodiment of the USB connector functionality modification system of FIG. 4 operating during the method of FIG. 5.

The method 500 begins at block 502 where a first subsystem transmits and receives data via a USB connector. With reference to FIG. 6A, in an embodiment of block 502, the multiplexer device 316 may be configured to allow the host subsystem 304 on the circuit board subsystem 300 to perform data transmit/receive operations 600 in order to transmit and/or receive data via the USB2 connection 324a between the host subsystem 304 and the multiplexer device 316, the USB 2.0 connection 322 between the multiplexer device 316 and the control panel connector 214, and the USB 2.0 connection 224d between the control panel connector 214 and the USB connector 208. As will be appreciated by one of skill in the art in possession of the present disclosure, at block 502, the data transmit/receive operations 600 may include the host subsystem 304 transmitting any of a variety of data via the USB connector 208. Furthermore, one of skill in the art in possession of the present disclosure will recognize that the configuration of the multiplexer device 316 to allow the host subsystem 304 to perform the data transmit/receive operations 600 also prevents the remote access controller subsystem 306 from performing similar data transmit/receive operations to transmit and/or receive data via the USB connector 208, thus providing the host subsystem 304 "ownership" of the USB connector 208 at block 502.

As discussed in further detail below, the USB ownership indicator 206 may be configured to indicate ownership of the USB connector 208, and in the specific examples below the USB ownership indicator 206 is not activated (e.g., illuminated) when the host subsystem 304 owns the USB connector 208 (e.g., no indication/illumination from the USB ownership indicator 206 indicates host subsystem ownership, while indication/illumination from the USB ownership indicator 206 indicates remote access controller subsystem ownership). However, other USB ownership indicator operations to indicate ownership of the USB connector 208 will fall within the scope of the present disclosure as well. Furthermore, while the embodiment of the method 500 described herein includes a USB connector 208 that defaults to "host ownership" that provides the host subsystem 304 with initial "ownership" of the USB connector 208a that is then modified such that the remote access controller subsystem 306 then owns the USB connector 208a, one of skill in the art in possession of the present disclosure will appreciate how the remote access controller subsystem 306 may initially own the USB connector 208 and that ownership may be modified to the host subsystem 304 while remaining within the scope of the present disclosure as well.

Figure 6B:
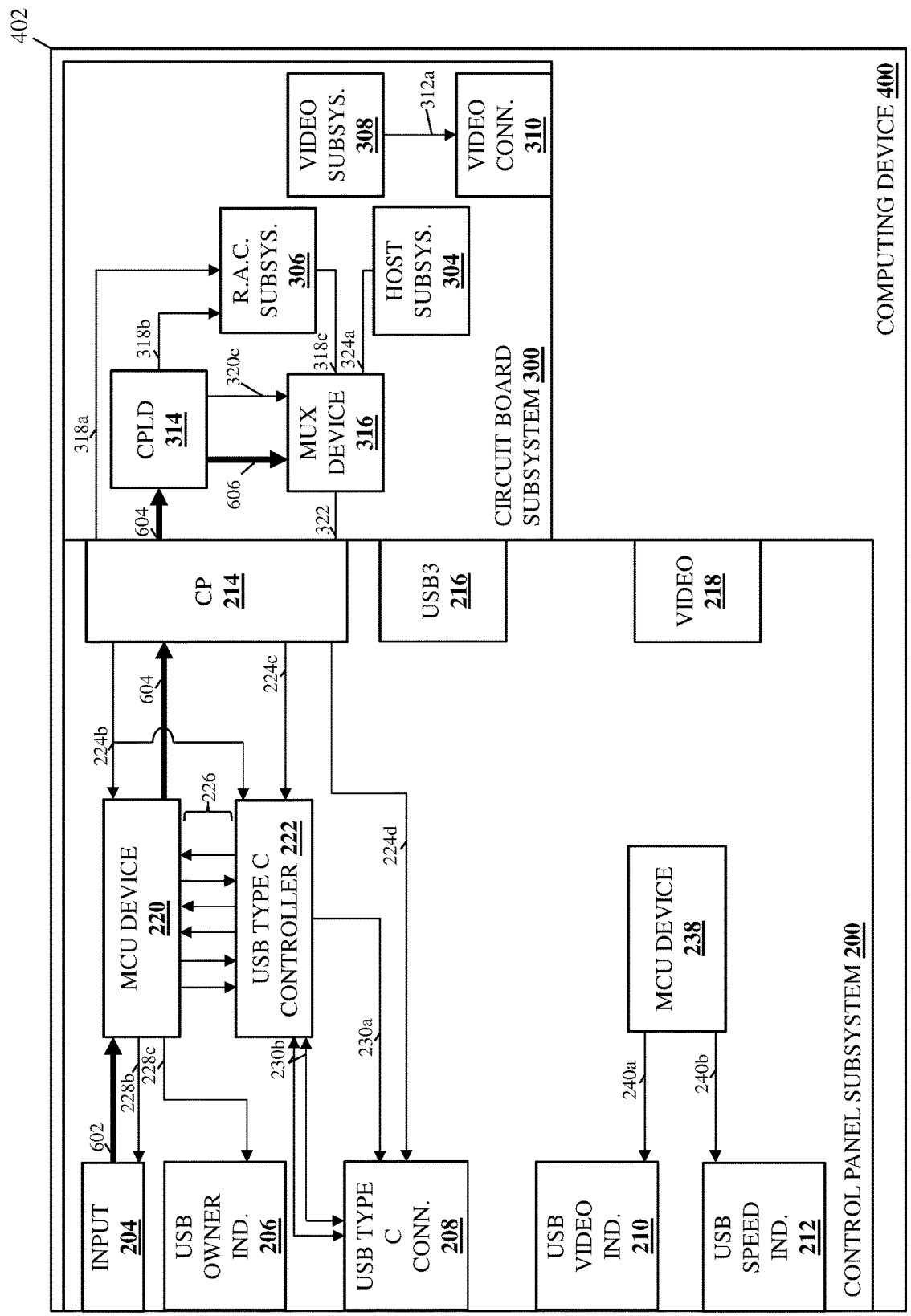
FIG. 6B is a schematic view illustrating an embodiment of the USB connector functionality modification system of FIG. 4 operating during the method of FIG. 5.

The method 500 then proceeds to block 504 where a USB connector functionality modification subsystem receives a USB connector functionality modification instruction. With reference to FIG. 6B, in an embodiment of block 504, the input subsystem 204 may perform USB connector functionality modification instruction transmission operations 602 to transmit a USB connector functionality modification instruction via the actuation detection connection 228a to the MCU device 220. As discussed above, in an embodiment the input subsystem 204 may be provided by an input button that is accessible on the outer surface of the chassis 402 of the computing device 400, and the input button may be configured to be actuated by a user to change the ownership of the USB connector 208. In a specific example, the user may actuate the input button provided by the input subsystem 204 for some period of time (e.g., by pressing the input button for 5 seconds) in order to cause the input subsystem 204 to transmit the USB connector functionality modification instruction to the MCU device 220, although one of skill in the art in possession of the present disclosure will apricate how other inputs/input combinations may be provided by a user at block 504 to transmit the USB connector functionality modification instruction while remaining within the scope of the present disclosure as well.

The method 500 then proceeds to block 506 where the USB connector functionality modification subsystem reconfigures a multiplexer device to allow the second subsystem to transmit and receive data via the USB connector while the first subsystem cannot transmit and receive data via the USB connected. With continued reference to FIG. 6B, in an embodiment of block 506 and in response to receiving the USB connector functionality modification instruction from the input subsystem 204, the MCU device 220 may perform multiplexer reconfiguration command transmission operations 604 that include transmitting multiplexer reconfiguration commands via the control panel 1-wire connection 224a, the control panel connector 214, and the control panel 1-wire connection 320a to the CPLD 314. In response to receiving the multiplexer reconfiguration commands, the CPLD 314 may perform multiplexer reconfiguration operations 606 via the CPLD connection 320b to reconfigure the multiplexer device 316 to allow the remote access controller subsystem 306 to transmit and/or receive data via the USB connector 208. As will be appreciated by one of skill in the art in possession of the present disclosure, the multiplexer device 316 may be reconfigured in a variety of manners to allow the remote access controller subsystem 306 to transmit and/or receive data via the USB connector 208, and one of skill in the art in possession of the present disclosure will appreciate how that reconfiguration will also prevent the host subsystem 304 from transmitting and/or receiving data via the USB connector 208 in the manner described above with reference to FIG. 6B, thus modifying the "ownership" of the USB connector 208 at block 506 from the host subsystem 304 to the remote access controller subsystem 306.

Figure 6C:
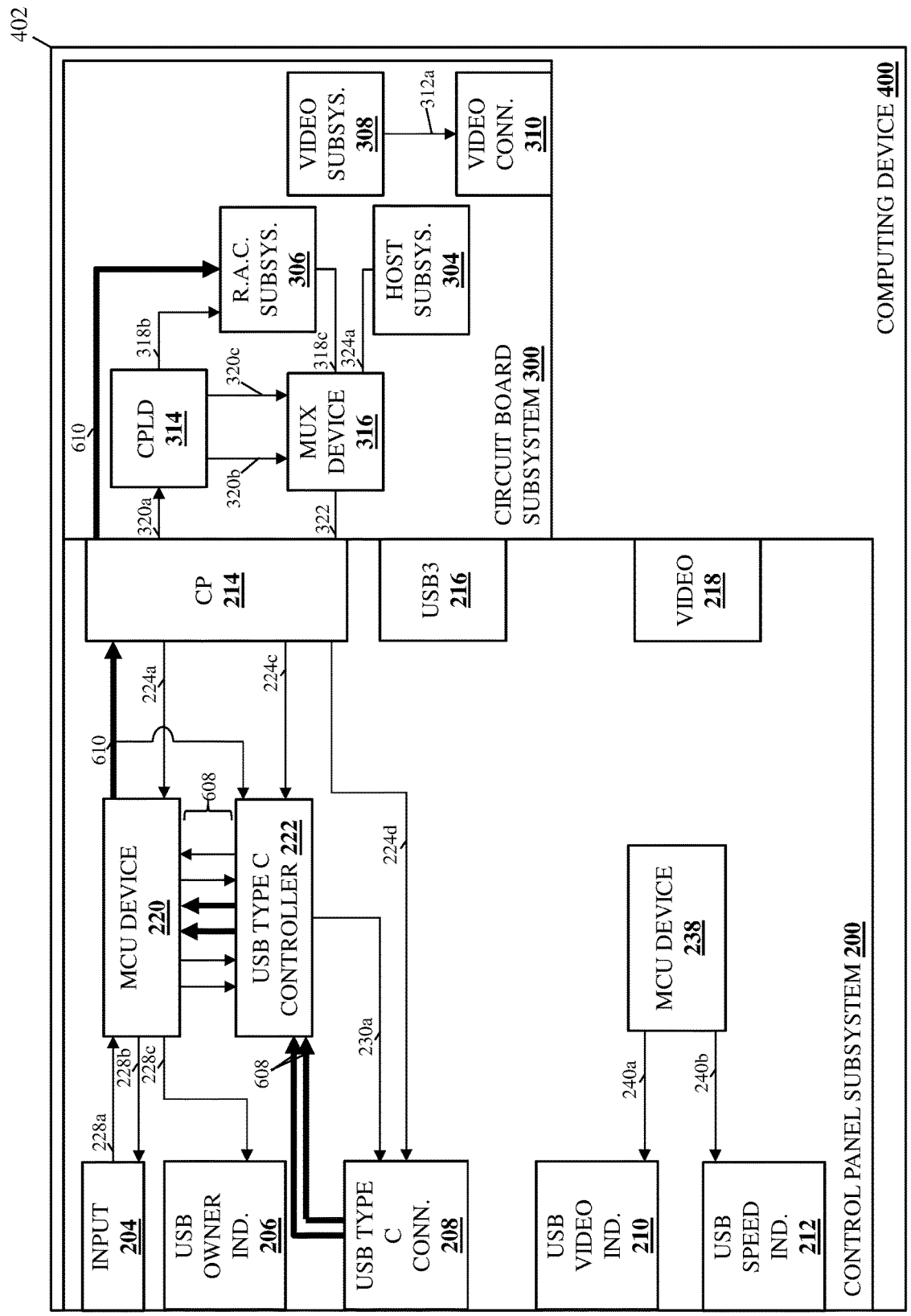
FIG. 6C is a schematic view illustrating an embodiment of the USB connector functionality modification system of FIG. 4 operating during the method of FIG. 5.

The method 500 then proceeds to optional block 508 where the USB connector functionality modification subsystem may identify a mode of a connected device. With reference to FIG. 6C, in an embodiment of optional block 508, the MCU device 220 may perform connected device mode identification operations 608 that include identifying a mode of a device connected to the USB connector 208 via the CC connections 230b, the USB controller 222, and one or more of the USB controller connections 226. In a specific example, at optional block 508, the USB controller 222 and USB connector 208 may operate to not advertise any mode, and rather may wait to detect a mode advertised by a device connected to the USB connector 208. However, one of skill in the art in possession of the present disclosure will appreciate how the connected device mode identification operations 608 may be performed in other manners that will fall within the scope of the present disclosure as well.

As such, in the event a device is connected to the USB connector 208, that device may "advertise" or otherwise indicate a mode of that connected device (e.g., via CC connections in the USB connector 208) that may be detected using the USB connector 222 and the MCU device 220, and while the examples below describe a "host" mode and a "device" mode, one of skill in the art in possession of the present disclosure will appreciate how other connected device modes may be identified at optional block 508 while remaining within the scope of the present disclosure as well. Furthermore, one of skill in the art in possession of the present disclosure will appreciate that if no device is connected to the USB connector 208, or if a device connected to the USB connector 208 does not advertise/indicate its mode, then optional blocks 508 and 510 may be skipped.

The method 500 then proceeds to optional block 510 where the USB connector functionality modification subsystem may configure a mode of a second subsystem based on the mode of the connected device. With continued reference to FIG. 6C, in an embodiment of optional block 510 and in response to identifying a mode of a device connected to the USB connector 208 at optional block 508, the MCU device may perform mode configuration operations 610 by transmitting mode configuration information via the I2C connection 224b, the control panel connector 214, and the I2C connection 318a to the remote access controller subsystem 306. For example, at optional block 510, the MCU device 220 may transmit the mode of the device connected to the USB connector 208 that was identified at optional block 508 to the remote access controller subsystem 306.

As will be appreciated by one of skill in the art in possession of the present disclosure, the remote access controller subsystem 306 may be configured to configure itself based on the mode of a device connected to the USB connector 208, and thus the receipt of the mode configuration information at optional block 510 by the remote access controller subsystem 306 may result in the configuration of the remote access controller subsystem 306 in a particular mode. In a specific example, the remote access controller subsystem 306 may be configured to advertise itself in a "host" mode when the device connected to the USB connector 208 advertises a "device" mode, and may be configured to advertise itself in a "device" mode when the device connected to the USB connector 208 advertises a "host" mode. As will be appreciated by one of skill in the art in possession of the present disclosure, with the device connected to the USB connector 208 advertising a particular mode and the remote access controller subsystem 306 then advertising a corresponding mode as discussed above, the remote access controller subsystem 306 may then perform a variety of mode configuration operations known in the art in order to configure itself in that corresponding mode (e.g., the "host" mode or "device" mode discussed above).

Figure 6D:
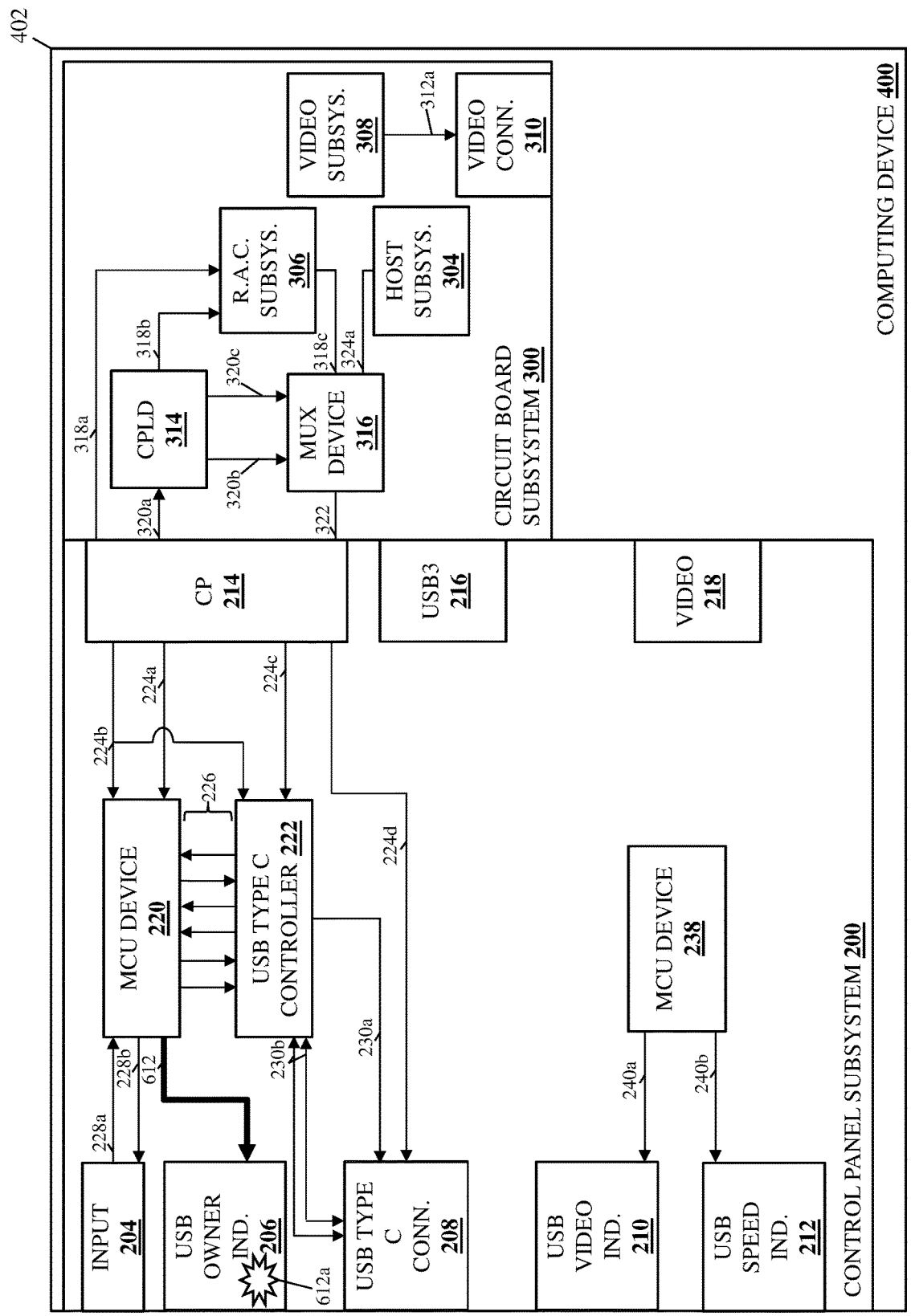
FIG. 6D is a schematic view illustrating an embodiment of the USB connector functionality modification system of FIG. 4 operating during the method of FIG. 5.

With reference to FIG. 6D, at some time following the reconfiguration of the multiplexer device 316 to allow the remote access controller subsystem 306 to transmit and/or receive data via the USB connector 208, the MCU device 220 may perform ownership indication operations 612 by transmitting a USB ownership indicator activation command via the indicator activation connection 228c to the USB ownership indicator 206. As illustrated in FIG. 6D, the USB ownership indicator activation command may be configured to cause the USB ownership indicator 206 to activate/illuminate to provide a USB ownership indication 612a. As discussed above, the USB ownership indicator 206 may be configured to indicate ownership of the USB connector 208, and in the specific examples below the USB ownership indicator 206 is activated (e.g., illuminated) when the remote access controller subsystem 306 owns the USB connector 208 (e.g., indication/illumination from the USB ownership indicator 206 indicates remote access controller subsystem ownership, while no indication/illumination from the USB ownership indicator 206 indicates host subsystem ownership). Furthermore, the USB ownership indicator 206 may be configured to indicate usage patterns of the USB connector 208 by the remote access controller subsystem 306 (e.g., via blinking and/or other indication patterns performed by the USB ownership indicator 206, etc.). As such, a user utilizing the input subsystem 204 to modify ownership of the USB connector 208 from the host subsystem 304 to the remote access controller subsystem 306 will be provided the USB ownership indication 612a to indicate that modified ownership, and that user will be able to determine ownership of the USB connector 208 quickly and easily by determining whether the USB ownership indicator 206 is activated/illuminated or not.

Figure 6E:
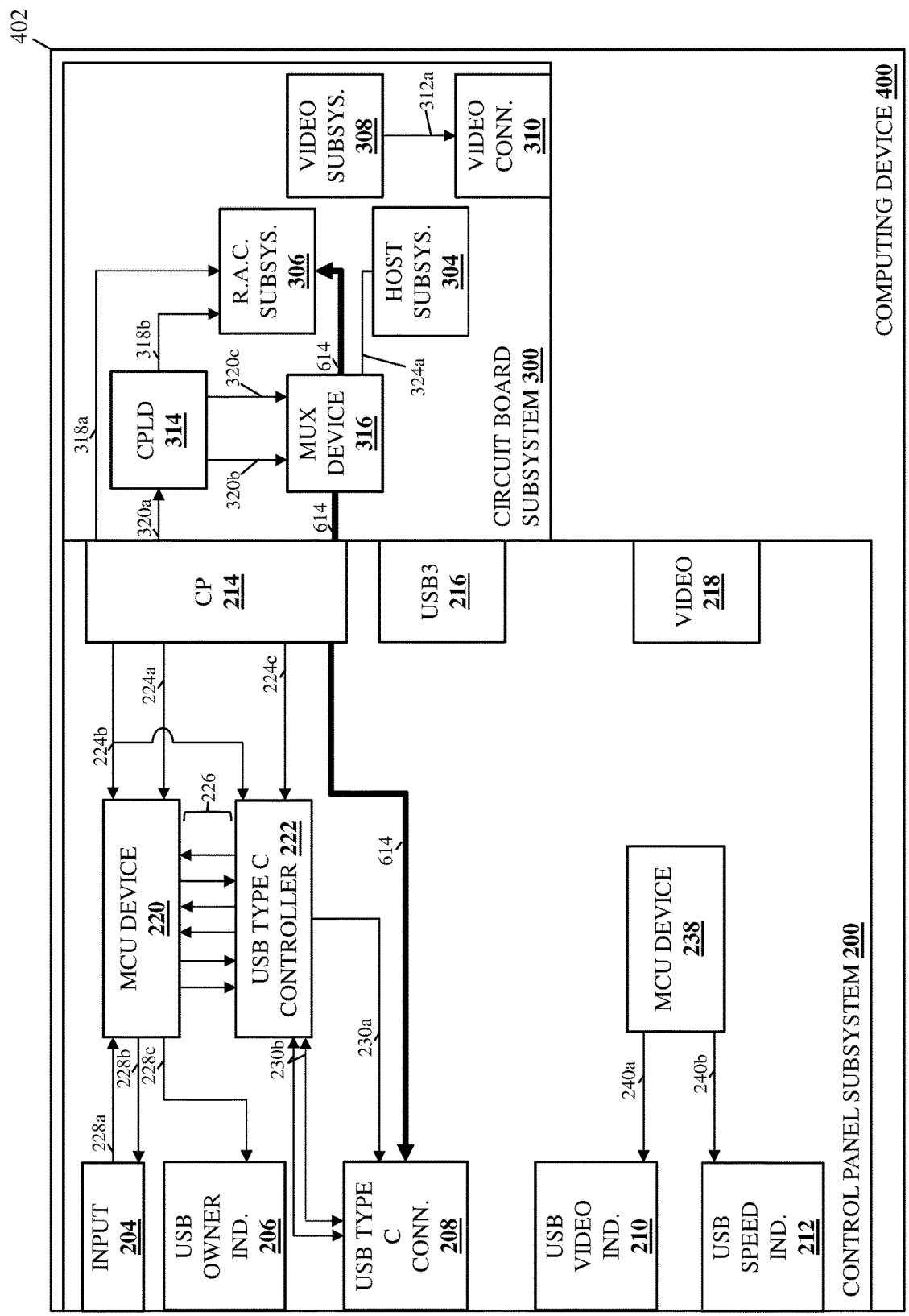
FIG. 6E is a schematic view illustrating an embodiment of the USB connector functionality modification system of FIG. 4 operating during the method of FIG. 5.

The method 500 then proceeds to block 512 where the second subsystem transmits and receives data via the USB connector. With reference to FIG. 6E, in an embodiment of block 512, the reconfiguration of the multiplexer device 316 at block 506 allows the remote access controller subsystem 306 on the circuit board subsystem 300 to perform data transmit/receive operations 614 in order to transmit and/or receive data via the USB2 OTG connection 318c between the remote access controller subsystem 306 and the multiplexer device 316, the USB 2.0 connection 322 between the multiplexer device 316 and the control panel connector 214, and the USB 2.0 connection 224d between the control panel connector 214 and the USB connector 208. As will be appreciated by one of skill in the art in possession of the present disclosure, at block 512, the data transmit/receive operations 614 may include the remote access controller subsystem 306 transmitting any of a variety of data via the USB connector 208. In a specific example, the data transmit/receive operations 614 performed by the remote access controller subsystem 306 may include any data transmission operations that may be performed as part of iDRAC Direct® functionality via the iDRAC® discussed above that is available in server devices provided by DELL® Inc. of Round Rock, Texas, United States. Furthermore, one of skill in the art in possession of the present disclosure will recognize how, with the remote access controller subsystem 306 owning the USB connector 208, the computing device 400 may be reconfigured without a power supply (e.g., in a box or on a cart without being connected to a power source) using a client system that powers the remote access controller subsystem 306 and transmits data to the remote access controller subsystem via the USB connector 208.

As will be appreciated by one of skill in the art in possession of the present disclosure, a user of the computing device 400 may then utilize the input subsystem 204 similarly as discussed above (e.g., by pressing an input button included in the input subsystem 204 for 5 seconds) to modify the ownership of the USB connector 208 back to the host subsystem 304. As such, the functionality of the USB connector 208 may be modified by switching ownership of that USB connector 208 between any of multiple subsystems in the computing device 400. However, while subsystem ownership of the USB connector 208 is discussed as being modified according to the teachings of the present disclosure, other functionality of the USB connector 208 may be modified as well. For example, FIGS. 6A-6E illustrate the computing device 400 configured in an embodiment of a "base" configuration for the computing device 400 that provides the USB connector 208 with a "base" USB speed (e.g., as a "high speed" USB port) and no video functionality, but the computing device 400 may be "upgraded" to increase the speed of the USB connector 208 (e.g., to a "super speed" USB port) and/or provide video functionality for that USB connector 208. Furthermore, while specific enhanced USB functionality subsystems that increase the speed of the USB connector 208 and/or enable the USB connector to transmit video are illustrated and described, one of skill in the art in possession of the present disclosure will appreciate how other enhanced USB functionality subsystems will fall within the scope of the present disclosure as well.

Figure 7:
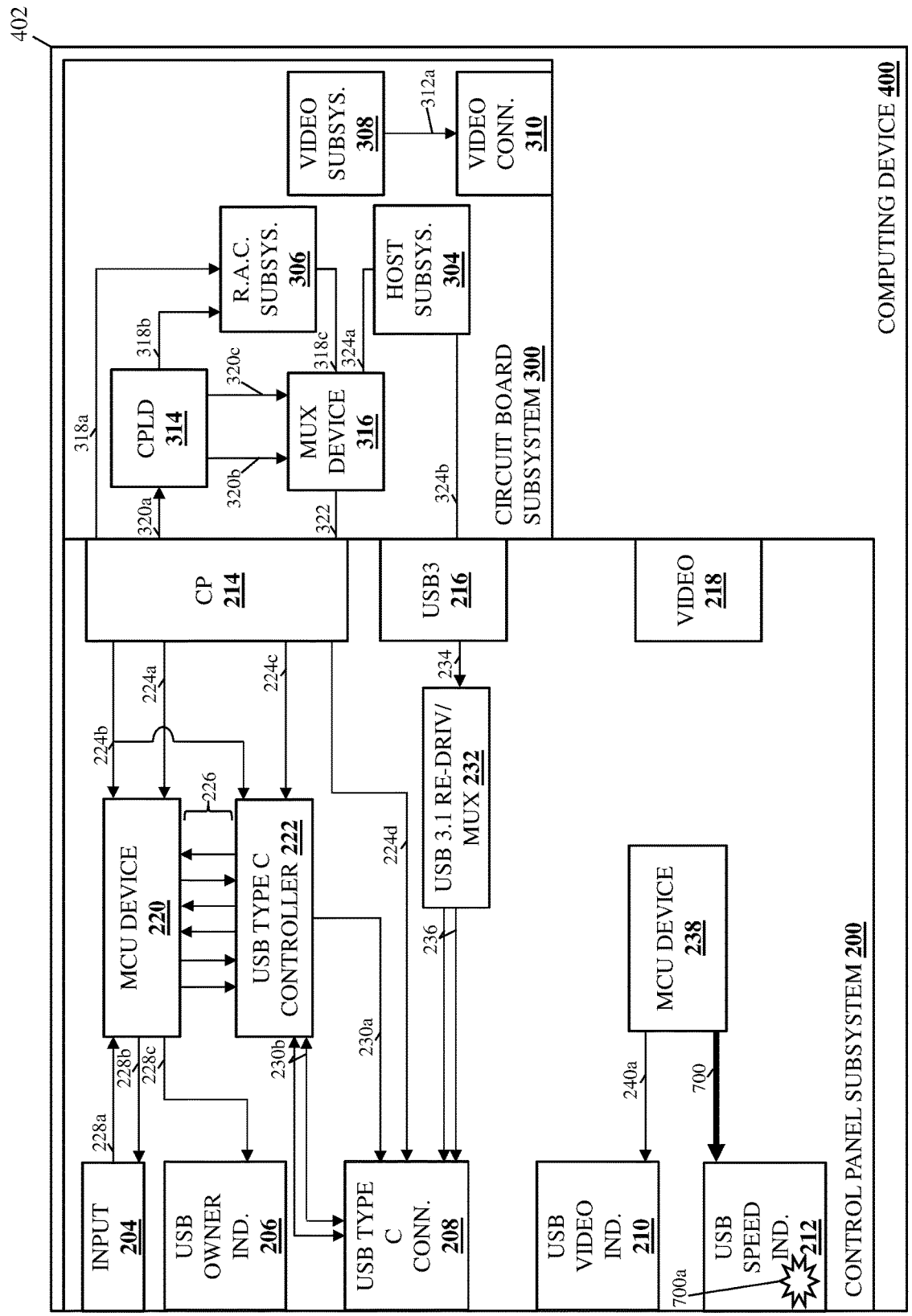
FIG. 7 is a schematic view illustrating an embodiment of the USB connector functionality modification system of FIG. 4 indicating modification of a USB connector via an enhanced USB functionality modification subsystem in the computing device.

With reference to FIG. 7, the computing device 400 is illustrated in an embodiment of a "USB-speed-upgrade" configuration in which the host subsystem 304 is connected to the USB3 connector 216 by the USB cable 324b on the circuit board subsystem 300, and the USB re-driver/multiplexer device 232 is provided on the control panel subsystem 200 and connected to the USB3 connector 216 by the USB connection 234, as well as connected to the USB connector 208 by the USB connections 236. As will be appreciated by one of skill in the art in possession of the present disclosure, the USB re-driver/multiplexer device 232, USB connections 234 and 236, and USB cable 324b operate to modify the configuration of the USB connector 208 from operating as a "high-speed" USB port to operating as a "super-speed" USB port. With continued reference to FIG. 7, the MCU device 238 may be configured to detect the "USB-speed-upgrade" configuration of the computing device 400 (e.g., via the presence of the USB cable 324b using, for example, a cable presence detect connection to the USB3 connector 216) and, in response, perform USB speed indicator activation operations 700 that include transmitting a USB speed indicator activation command via the indicator activation connection 240b to the USB speed indicator 212.

As illustrated in FIG. 7, the USB speed indicator activation command may be configured to cause the USB speed indicator 212 to activate/illuminate to provide a USB speed indication 700a. As discussed above, the USB speed indicator 212 may be configured to indicate a speed of the USB connector 208, and in the specific examples below the USB speed indicator 212 is activated (e.g., illuminated) when the USB connector 208 is configured as a USB "super-speed" USB port (e.g., indication/illumination from the USB speed indicator 212 indicates the USB connector 208 is configured as a "super-speed" port, while no indication/illumination from the USB speed indicator 212 indicates the USB connector 208 is configured as a "high-speed" USB port). As such, a user that has upgraded their computing device 400 to increase the speed of the USB connector 208 will be provided the USB speed indication 700a to indicate that increased speed, and that user will be able to confirm the increased speed of the USB connector 208 quickly and easily by determining whether the USB speed indicator 212 is activated/illuminated or not.

Figure 8:
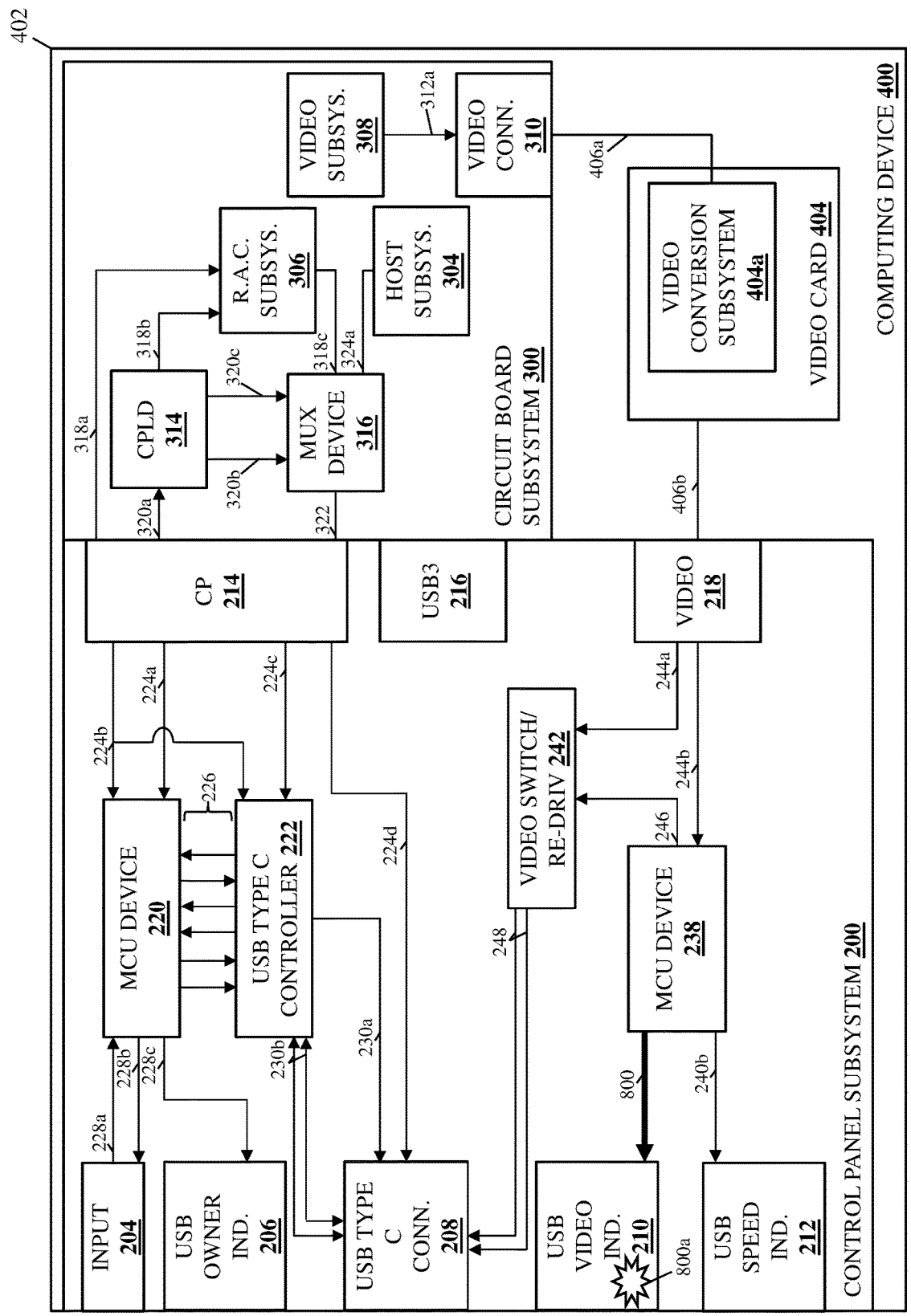
FIG. 8 is a schematic view illustrating an embodiment of the USB connector functionality modification system of FIG. 4 indicating modification of a USB connector via an enhanced USB functionality modification subsystem in the computing device.

With reference to FIG. 8, the computing device 400 is illustrated in an embodiment of a "USB-video-upgrade" configuration in which the video card 404 including the video conversion subsystem 404a is provided in the chassis 402 of the computing device 400 and connected to the internal video connector 310 by the video cable 406a, and to the video connector 218 by the video cable 406b. Furthermore, the "USB-video-upgrade" configuration also includes the video switch/re-driver device 242 on the control panel subsystem 200 connected to the USB connector 208 by the video connections 248, to the MCU device 238 by the multiplexer select connection 246, and connected to the video connector 218 by the video connection 244a. Finally, the "USB-video-upgrade" configuration also includes the video connector 218 connected to the MCU device 238 by the video cable present detect connection 244b. As will be appreciated by one of skill in the art in possession of the present disclosure, the video card 404, the video switch/re-driver device 242, the video cables 406a and 406b, video connections 244a and 248, the multiplexer select connection 246, and the video cable present detect connection 244b operate to modify the configuration of the USB connector 208 to allow video to be transmitted from the host subsystem 304 and/or the remote access controller subsystem 306 to the USB connector 208.

To provide a specific example, the video subsystem 308 may transmit video data in a VGA format via a VGA connector provided by the internal video connector 310 and a VGA cable provided by the video cable 406a to a VGA-to-DisplayPort conversion processor provided by the video conversion subsystem 404. The VGA-to-DisplayPort conversion processor may convert that data from the VGA format to a DisplayPort format, and then transmit that data in the DisplayPort format via a DisplayPort cable provided by the video cable 406a, a DisplayPort connector provided by the video connector 218, and via a DisplayPort connection 244a provided by the video connection 244a to a DisplayPort switch/redriver device provided by the video switch/re-driver device 242. The DisplayPort switch/re-driver device may then provide that data in the DisplayPort format via DisplayPort connections provided by the video connections 248 to the USB connector 208. One of skill in the art in possession of the present disclosure will appreciate how the "USB-video-upgrade" configuration of the computing device 400 illustrated in FIG. 8 allows upgrade of the computing device 400 to support, for example, a single "crash-cart"-targeted USB Type-C port.

With continued reference to FIG. 8, the MCU device 238 may be configured to detect the "USB-video-upgrade" configuration of the computing device 400 (e.g., via the connection of the video cable 406b to the video connector 218 and the video cable present detect connection 244b) and, in response, perform USB video indicator activation operations 800 that include transmitting a USB video indicator activation command via the indicator activation connection 240a to the USB video indicator 210. As illustrated in FIG. 8, the USB video indicator activation command may be configured to cause the USB video indicator 210 to activate/illuminate to provide a USB video indication 800a. As discussed above, the USB video indicator 210 may be configured to indicate video capabilities of the USB connector 208, and in the specific examples below the USB video indicator 212 is activated (e.g., illuminated) when the USB connector 208 is configured to transmit video (e.g., indication/illumination from the USB speed indicator 212 indicates the USB connector 208 is configured to transmit DisplayPort video). As such, a user that has upgraded their computing device 400 to provide for video transmission via the USB connector 208 will be provided the USB video indication 800a to indicate that video capability, and that user will be able to confirm the video capability of the USB connector 208 quickly and easily by determining whether the USB video indicator 210 is activated/illuminated or not.

Thus, systems and methods have been described that provide for modification of the functionality of a USB connector by changing the "ownership" of the USB connector between different subsystems in a computing device and providing an ownership indication to a user, modifying the speed of the USB connector and providing a speed indication to a user, and enabling video via the USB connector and providing a video indication to a user. For example, the USB connector functionality modification system includes a USB connector coupled to a first subsystem and a second subsystem by a multiplexer device. A USB connector functionality modification subsystem is coupled to the multiplexer device and operates to receive a USB connector functionality modification instruction while the multiplexer device is configured to allow the first subsystem to transmit and receive data via the USB connector and the second subsystem cannot transmit and receive data via the USB connector. In response to receiving the USB connector functionality modification instruction, the USB connector functionality modification subsystem reconfigures the multiplexer device to allow the second subsystem to transmit and receive data via the USB connector while the first subsystem cannot transmit and receive data via the USB connector. As such, a single USB connector may have its functionality modified to support a variety of different subsystems in a computing device, thus reducing the number of connectors required on the outer surface of a computing device while maintaining functionality.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A Universal Serial Bus (USB) connector functionality modification system, comprising:

a Universal Serial Bus (USB) connector;
a first subsystem;
a second subsystem;
a multiplexer device that couples the first subsystem and the second subsystem to the USB connector;
a USB connector ownership indicator; and
a USB connector functionality modification subsystem that is coupled to the multiplexer device and the USB connector ownership indicator, wherein the USB connector functionality modification subsystem is configured to:
receive, while the multiplexer device is configured to allow the first subsystem to transmit and receive data via the USB connector and the second subsystem cannot transmit and receive data via the USB connector, a USB connector functionality modification instruction;
reconfigure, in response to receiving the USB connector functionality modification instruction, the multiplexer device to allow the second subsystem to transmit and receive data via the USB connector while the first subsystem cannot transmit and receive data via the USB connector; and
activate, in response to reconfiguring the multiplexer device to allow the second subsystem to transmit and receive data via the USB connector, the USB connector ownership indicator to provide a visual indication that the second subsystem is allowed to transmit and receive data via the USB connector while the first subsystem cannot transmit and receive data via the USB connector.

2. The system of claim 1, wherein the first subsystem is a host subsystem, and the second subsystem is a remote access controller subsystem.

3. The system of claim 1, wherein the USB connector is a USB Type-C connector.

4. The system of claim 1, wherein the USB connector functionality modification subsystem is configured to:
identify a first mode of a connected device that is connected to the USB connector; and
configure, based on the first mode identified for the connector device, the second subsystem in a second mode.

5. The system of claim 1, wherein the USB connector functionality modification subsystem includes:
a MicroController Unit (MCU) device that is configured to:
receive the USB connector functionality modification instruction; and
transmit, in response to receiving the USB connector functionality modification instruction, a USB connector functionality modification command; and
a Complex Programmable Logic Device (CPLD) that is coupled to the MCU device and the multiplexer device, wherein the CPLD is configured to:
receive the USB connector functionality modification command; and
reconfigure, in response to receiving the USB connector functionality modification command, the multiplexer device to allow the second subsystem to transmit and receive data via the USB connector while the first subsystem cannot transmit and receive data via the USB connector.

6. The system of claim 1, further comprising:
an input device that is coupled to the USB connector functionality modification subsystem, wherein the USB connector functionality modification subsystem is configured to receive the USB connector functionality modification instruction in response to actuation of the input device,
wherein the USB connector functionality modification subsystem is configured to activate, in response to receiving the USB connector functionality modification instruction, a Light Emitting Device (LED) included on the USB connector ownership indicator in order to provide the visual indication that the second subsystem is allowed to transmit and receive data via the USB connector while the first subsystem cannot transmit and receive data via the USB connector.

7. An Information Handling System (IHS), comprising:
a processing system; and
a memory system that is coupled to the processing system and that includes instructions that, when executed by the processing system, cause the processing system to provide a USB connector functionality modification engine that is configured to:
receive, while a multiplexer device is configured to allow a first subsystem to transmit and receive data via a USB connector and a second subsystem cannot transmit and receive data via the USB connector, a USB connector functionality modification instruction;
reconfigure, in response to receiving the USB connector functionality modification instruction, the multiplexer device to allow the second subsystem to transmit and receive data via the USB connector while the first subsystem cannot transmit and receive data via the USB connector; and
activate, in response to reconfiguring the multiplexer device to allow the second subsystem to transmit and receive data via the USB connector, a USB connector ownership indicator to provide a visual indication that the second subsystem is allowed to transmit and receive data via the USB connector while the first subsystem cannot transmit and receive data via the USB connector.

8. The IHS of claim 7, wherein the first subsystem is a host subsystem, and the second subsystem is a remote access controller subsystem.

9. The IHS of claim 7, wherein the USB connector is a USB Type-C connector.

10. The IHS of claim 7, wherein the USB connector functionality modification engine is configured to:
identify a first mode of a connected device that is connected to the USB connector; and
configure, based on the first mode identified for the connector device, the second subsystem in a second mode.

11. The IHS of claim 7, wherein the USB connector functionality modification engine includes:
a MicroController Unit (MCU) device that is configured to:
receive the USB connector functionality modification instruction; and
transmit, in response to receiving the USB connector functionality modification instruction, a USB connector functionality modification command; and
a Complex Programmable Logic Device (CPLD) that is coupled to the MCU device and the multiplexer device, wherein the CPLD is configured to:
receive the USB connector functionality modification command; and
reconfigure, in response to receiving the USB connector functionality modification command, the multiplexer device to allow the second subsystem to transmit and receive data via the USB connector while the first subsystem cannot transmit and receive data via the USB connector.

12. The IHS of claim 7, wherein the USB connector functionality modification engine is configured to:
receive the USB connector functionality modification instruction in response to actuation of an input device; and
activate, in response to receiving the USB connector functionality modification instruction, a Light Emitting Device (LED) included on the USB connector ownership indicator in order to provide the visual indication that the second subsystem is allowed to transmit and receive data via the USB connector while the first subsystem cannot transmit and receive data via the USB connector.

13. The IHS of claim 7, wherein the USB connector functionality modification engine is configured to:
detect an enhanced USB functionality subsystem is coupled to the USB connector and provides enhanced functionality for the USB connector; and
activate, in response to detecting the enhanced USB functionality subsystem, an enhanced USB functionality indicator in order to indicate that the enhanced USB functionality subsystem is coupled to the USB connector and provides enhanced functionality for the USB connector.

14. A method for modifying functionality of a Universal Serial Bus (USB) connector, comprising:
receiving, by a USB connector functionality modification subsystem while a multiplexer device is configured to allow a first subsystem to transmit and receive data via a USB connector and a second subsystem cannot transmit and receive data via the USB connector, a USB connector functionality modification instruction;
reconfiguring, by the USB connector functionality modification subsystem in response to receiving the USB connector functionality modification instruction, the multiplexer device to allow the second subsystem to transmit and receive data via the USB connector while the first subsystem cannot transmit and receive data via the USB connector; and
activating, by the USB connector functionality modification subsystem in response to reconfiguring the multiplexer device to allow the second subsystem to transmit and receive data via the USB connector, a USB connector ownership indicator to provide a visual indication that the second subsystem is allowed to transmit and receive data via the USB connector while the first subsystem cannot transmit and receive data via the USB connector.

15. The method of claim 14, wherein the first subsystem is a host subsystem, and the second subsystem is a remote access controller subsystem.

16. The method of claim 14, wherein the USB connector is a USB Type-C connector.

17. The method of claim 14, further comprising:
identifying, by the USB connector functionality modification subsystem, a first mode of a connected device that is connected to the USB connector; and
configuring, by the USB connector functionality modification subsystem based on the first mode identified for the connector device, the second subsystem in a second mode.

18. The method of claim 14, further comprising:
receiving, by a MicroController Unit (MCU) device included in the USB connector functionality modification subsystem, the USB connector functionality modification instruction;
transmitting, by the MCU device in response to receiving the USB connector functionality modification instruction, a USB connector functionality modification command;
receiving, by a Complex Programmable Logic Device (CPLD) that is included in the USB connector functionality modification subsystem and that is coupled to the MCU device and the multiplexer device, the USB connector functionality modification command; and
reconfiguring, by the CPLD in response to receiving the USB connector functionality modification command, the multiplexer device to allow the second subsystem to transmit and receive data via the USB connector while the first subsystem cannot transmit and receive data via the USB connector.

19. The method of claim 14, further comprising:
receiving, by the USB connector functionality modification subsystem, the USB connector functionality modification instruction in response to actuation of an input device; and
activating, by the USB connector functionality modification subsystem in response to receiving the USB connector functionality modification instruction, a Light Emitting Device (LED) included on the USB connector ownership indicator in order to provide the visual indication that the second subsystem is allowed to transmit and receive data via the USB connector while the first subsystem cannot transmit and receive data via the USB connector.

20. The method of claim 14, further comprising:
detecting, by the USB connector functionality modification subsystem, an enhanced USB functionality subsystem is coupled to the USB connector and provides enhanced functionality for the USB connector; and
activating, by the USB connector functionality modification subsystem in response to detecting the enhanced USB functionality subsystem, an enhanced USB functionality indicator in order to indicate that the enhanced USB functionality subsystem is coupled to the USB connector and provides enhanced functionality for the USB connector.

* * * * *